(12) United States Patent
Myong (10) Patent No.: US 8,735,715 B2
(45) Date of Patent: May 27, 2014

(54) TANDEM PHOTOVOLTAIC DEVICE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 235 days.

(21) Appl. No.: 12/987,142

(22) Filed: Jan. 9, 2011

(65) Prior Publication Data

US 2011/0253203 A1 Oct. 20, 2011

(30) Foreign Application Priority Data

Apr. 20, 2010 (KR) .................. 10-2010-0036309

(51) Int. Cl.
*H01L 31/18* (2006.01)

(52) U.S. Cl.
USPC ........... 136/255; 136/256; 136/258; 136/261; 136/252; 438/71; 438/74; 438/96; 257/E31.126; 257/E31.061

(58) Field of Classification Search
USPC ............ 136/255, 256, 258, 261, 252; 438/71, 438/74, 96; 257/E31.126, E31.061
See application file for complete search history.

(56) References Cited

U.S. PATENT DOCUMENTS

| | | | | |
|---|---|---|---|---|
| 4,554,727 A | * | 11/1985 | Deckman et al. | 438/71 |
| 4,663,495 A | * | 5/1987 | Berman et al. | 136/248 |
| 5,244,509 A | * | 9/1993 | Arao et al. | 136/259 |
| 5,296,045 A | * | 3/1994 | Banerjee et al. | 136/249 |
| 5,453,135 A | * | 9/1995 | Nakagawa et al. | 136/259 |
| 5,589,403 A | * | 12/1996 | Toyama et al. | 438/71 |
| 5,620,530 A | * | 4/1997 | Nakayama | 136/259 |
| 5,977,477 A | * | 11/1999 | Shiozaki | 136/256 |
| 6,043,427 A | * | 3/2000 | Nishimoto | 136/258 |
| 6,812,499 B2 | * | 11/2004 | Kondo et al. | 257/95 |
| 7,875,945 B2 | * | 1/2011 | Krasnov et al. | 257/436 |
| 2002/0050289 A1 | * | 5/2002 | Wada et al. | 136/256 |
| 2002/0117661 A1 | * | 8/2002 | Kondo et al. | 257/21 |
| 2005/0016583 A1 | * | 1/2005 | Blieske et al. | 136/256 |
| 2005/0039788 A1 | * | 2/2005 | Blieske et al. | 136/246 |
| 2005/0145972 A1 | | 7/2005 | Fukuda et al. | |

(Continued)

FOREIGN PATENT DOCUMENTS

| | | |
|---|---|---|
| CN | 101593779 | 12/2009 |
| JP | 2003347572 | 12/2003 |
| KR | 100295432 | 7/2001 |

OTHER PUBLICATIONS

Fukuda et al., JP 2003-347572 A online machine translation, translated on Nov. 19, 2012.*

*Primary Examiner* — Golam Mowla
(74) *Attorney, Agent, or Firm* — H.C. Park & Associates, PLC (57) ABSTRACT

Disclosed is a photovoltaic device that comprises: a first electrode including a transparent conductive oxide layer; a first unit cell being placed on the first electrode; a second unit cell being placed on the first unit cell; and a second electrode being placed on the second unit cell, wherein the intrinsic semiconductor layer of the first unit cell includes hydrogenated amorphous silicon or hydrogenated amorphous silicon based material, wherein an intrinsic semiconductor layer of the second unit cell includes hydrogenated microcrystalline silicon or hydrogenated microcrystalline silicon based material, and wherein a ratio of a root mean square roughness to an average pitch of a texturing structure formed on the surface of the first electrode is equal to or more than 0.05 and equal to or less than 0.13.

20 Claims, 4 Drawing Sheets

(56) References Cited

U.S. PATENT DOCUMENTS

| | | | |
|---|---|---|---|
| 2006/0043517 A1* | 3/2006 | Sasaki et al. | 257/458 |
| 2007/0151596 A1* | 7/2007 | Nasuno et al. | 136/256 |
| 2008/0163917 A1* | 7/2008 | Rech et al. | 136/244 |
| 2008/0185036 A1* | 8/2008 | Sasaki et al. | 136/252 |
| 2008/0196761 A1* | 8/2008 | Nakano et al. | 136/258 |
| 2009/0194155 A1* | 8/2009 | den Boer et al. | 136/256 |
| 2009/0194157 A1* | 8/2009 | den Boer et al. | 136/256 |
| 2009/0320910 A1* | 12/2009 | Matsui et al. | 136/252 |
| 2010/0269897 A1* | 10/2010 | Sakai et al. | 136/255 |
| 2012/0012168 A1* | 1/2012 | Goya et al. | 136/255 |

* cited by examiner

TANDEM PHOTOVOLTAIC DEVICE AND METHOD FOR MANUFACTURING THE SAME

CROSS-REFERENCE TO RELATED APPLICATION

This application claims the benefit of Korean Patent Application No. 10-2010-0036309 filed on Apr. 20, 2010, which is hereby incorporated by reference.

FIELD OF INVENTION

The present invention is related to a tandem photovoltaic device and a method for manufacturing the same.

BACKGROUND OF THE INVENTION

Recently, as existing energy resources like oil and coal and the like are expected to be exhausted, much attention is increasingly paid to alternative energy sources which can be used in place of the existing energy sources. As an alternative energy sources, sunlight energy is abundant and has no environmental pollution. Therefore, more and more attention is paid to the sunlight energy.

A photovoltaic device, that is, a solar cell directly converts sunlight energy into electrical energy. The photovoltaic device mainly uses photovoltaic effect of semiconductor junction. In other words, when light is incident on and absorbed by a semiconductor p-i-n junction doped with p-type impurity and n-type impurity respectively, light energy generates electrons and holes within the semiconductor and the electrons and the holes are separated from each other by an internal field. As a result, a photo-electro motive force is generated between both ends of the p-i-n junction. Here, when electrodes are formed at both ends of the junction and connected with wires, electric current flows externally through the electrodes and the wires.

In order that the existing energy sources such as oil is substituted with the sunlight energy source, it is necessary to provide a photovoltaic device with high photovoltaic conversion efficiency.

SUMMARY OF THE INVENTION

One aspect of the present invention is a photovoltaic device. The photovoltaic device includes: a first electrode including a transparent conductive oxide layer; a first unit cell being placed on the first electrode and including a p-type semiconductor layer, an intrinsic semiconductor layer and an n-type semiconductor layer, each of which is sequentially stacked; a second unit cell being placed on the first unit cell and including a p-type semiconductor layer, an intrinsic semiconductor layer and an n-type semiconductor layer, each of which is sequentially stacked; and a second electrode being placed on the second unit cell, wherein the intrinsic semiconductor layer of the first unit cell includes hydrogenated amorphous silicon or hydrogenated amorphous silicon based material, wherein the intrinsic semiconductor layer of the second unit cell includes hydrogenated microcrystalline silicon or hydrogenated microcrystalline silicon based material, and wherein a ratio of a root mean square roughness to an average pitch of a texturing structure formed on the surface of the first electrode is equal to or more than 0.05 and equal to or less than 0.13.

Another aspect of the present invention is a method for manufacturing a photovoltaic device. The method includes: forming a first electrode by depositing a transparent conductive oxide layer on a substrate and by etching a surface of the transparent conductive oxide layer; forming a first unit cell including a p-type semiconductor layer, an intrinsic semiconductor layer and an n-type semiconductor layer, each of which is sequentially stacked on the first electrode; forming a second unit cell including a p-type semiconductor layer, an intrinsic semiconductor layer and an n-type semiconductor layer, each of which is sequentially stacked on the first unit cell; and forming a second electrode on the second unit cell, wherein the intrinsic semiconductor layer of the first unit cell includes hydrogenated amorphous silicon or hydrogenated amorphous silicon based material, wherein the intrinsic semiconductor layer of the second unit cell includes hydrogenated microcrystalline silicon or hydrogenated microcrystalline silicon based material, and wherein a ratio of a root mean square roughness to an average pitch of a texturing structure formed on the surface of the first electrode is equal to or more than 0.05 and equal to or less than 0.13.

DETAILED DESCRIPTION

Hereinafter, an embodiment of the present invention will be described in detail with reference to the accompanying drawings.

FIGS. 1a to 1e show a process of manufacturing a tandem photovoltaic device according to an embodiment of the present invention. In the embodiment or the present invention, a process for connecting unit cells in series, such as a laser patterning process, will be omitted for the convenience of description.

Figure 1A:
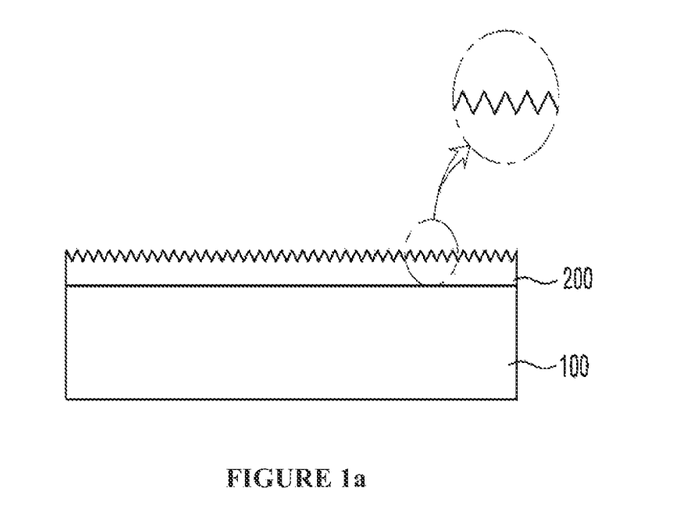
FIGS. 1a to 1e show a process of manufacturing a tandem photovoltaic device according to an embodiment of the present invention.

As shown in FIG. 1a, a transparent conductive oxide layer is deposited on a substrate 100. When the transparent conductive oxide layer such as ZnO or ITO is deposited, the surface of the transparent conductive oxide layer is textured. That is, when the transparent conductive oxide layer is deposited by using a chemical vapor deposition (CVD), a texturing structure shaped like sharp pyramid tips is formed on the surface of the transparent conductive oxide layer as shown in FIG. 1a. Here, the substrate 100 has excellent optical transmittance, and may be composed of transparent insulating material for preventing an internal short-circuit within a thin film solar cell.

Figure 1B:
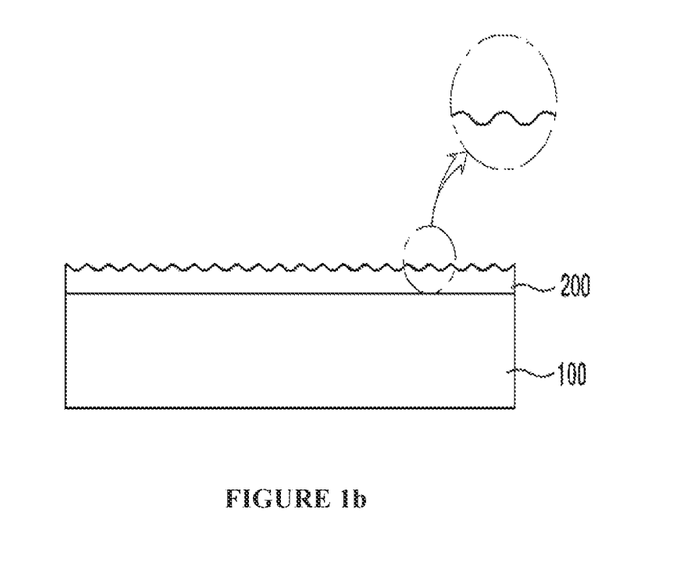

As shown in FIG. 1b, the textured surface of the transparent conductive oxide layer is etched by a wet etching process. Accordingly, the surface of a first electrode 200 is smoothly textured. The wet etching process can reduce a time required for smoothing the textured surface. In other words, since the wet etching process has a higher etching rate than that of a dry etching process, it is possible to reduce a time required for forming the first electrode 200. The wet etching process is performed by immersing the substrate on which the first electrode 200 has been deposited in an acid aqueous solution having a concentration of equal to or more than 0.5% and equal to or less than 5% for equal to or more than 5 seconds and equal to or less than 20 seconds. When the concentration of the acid aqueous solution is less than 0.5%, an etch rate becomes too low and much time is required for the etching. When the concentration of the acid aqueous solution is more than 5%, the etch rate becomes too high and it is difficult to control the etching so that the surface texture becomes uneven. That is to say, when the concentration of the acid aqueous solution is equal to or more than 0.5% and equal to or less than 5%, it is possible to sufficiently etch the surface as well as to control the etching.

Additionally, when the etching by the acid aqueous solution is performed for less than 5 seconds, the etching may be insufficiently performed. When the etching by the acid aqueous solution is performed for more than 20 seconds, the surface texture becomes too smooth and light trapping effect is reduced so that a short-circuit current is reduced. Further, zinc oxide becomes too thin so that conductivity is reduced. A curve fill factor is also reduced. Consequently, conversion efficiency may be reduced. Therefore, when the etching by the acid aqueous solution is performed for equal to or more than 5 seconds and equal to or less than 20 seconds, the smooth surface texture can be obtained within a short time. Further, the light trapping effect and a short circuit current are not reduced. Also, it is possible to prevent the conversion efficiency from being reduced caused by the reductions of the conductivity and the curve fill factor.

Here, at least one of $HCl$, $HPO_3$, $HNO_3$, $CH_3COOH$ can be used as an acid for the wet etching process.

An etching of the transparent conductive oxide layer will be described in detail with reference to the drawings.

Figure 1C:
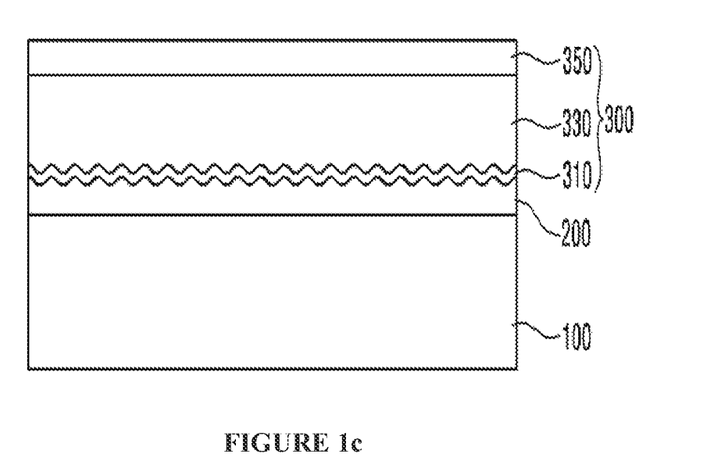

As shown in 1c, a first unit cell 300 is formed on the first electrode 200. The first unit cell 300 includes a first conductive semiconductor layer 310, an intrinsic semiconductor layer 330 and a second conductive semiconductor layer 350, each of which is sequentially stacked. In the embodiment of the present invention, the first conductive semiconductor layer 310, the intrinsic semiconductor layer 330 and the second conductive semiconductor layer 350 may correspond to a p-type semiconductor layer, an intrinsic semiconductor layer and an n-type semiconductor layer respectively.

Here, the intrinsic semiconductor layer 330 of the first unit cell 300 placed on the first electrode 200 may be composed of hydrogenated amorphous silicon or hydrogenated amorphous silicon based material. In the embodiment of the present invention, the amorphous silicon based material may include a non-silicon based element such as oxygen, carbon or nitrogen. For example, when the intrinsic semiconductor layer 330 includes oxygen, carbon or nitrogen, the intrinsic semiconductor layer 330 can include hydrogenated amorphous silicon oxide (a-SiO:H), hydrogenated amorphous silicon carbide (a-SiC:H) or hydrogenated amorphous silicon nitride (a-SiN:H).

Figure 1D:
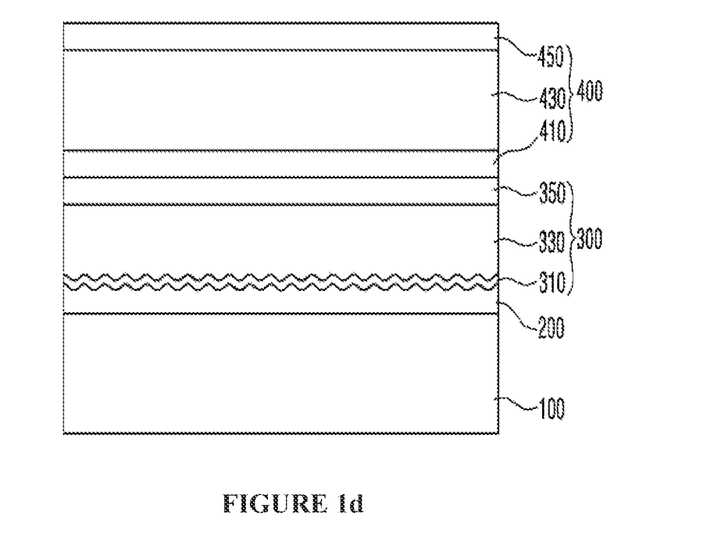

As shown in FIG. 1d, a second unit cell 400 is formed on the first unit cell 300. The second unit cell 400 includes a first conductive semiconductor layer 410, an intrinsic semiconductor layer 430 and a second conductive semiconductor layer 450, each of which is sequentially stacked. In the embodiment of the present invention, the first conductive semiconductor layer 410, the intrinsic semiconductor layer 430 and the second conductive semiconductor layer 450 may correspond to a p-type semiconductor layer, an intrinsic semiconductor layer and an n-type semiconductor layer respectively.

Here, the intrinsic semiconductor layer 430 of the second unit cell 400 may be composed of hydrogenated microcrystalline silicon or hydrogenated microcrystalline silicon based material. In the embodiment of the present invention, the microcrystalline silicon based material may include a non-silicon element such as germanium. For example, when the intrinsic semiconductor layer 430 includes germanium, the intrinsic semiconductor layer 430 can include hydrogenated microcrystal line silicon germanium (μc-SiGe:H).

In the embodiment of the present invention, since the first unit cell 300 and the second unit cell 400 are p-i-n type unit cells, light is incident through the substrate 100. Additionally, the first unit cell 300 includes hydrogenated amorphous silicon or hydrogenated amorphous silicon based material. The second unit cell 400 includes hydrogenated microcrystalline silicon or hydrogenated microcrystalline silicon based material.

Figure 1E:
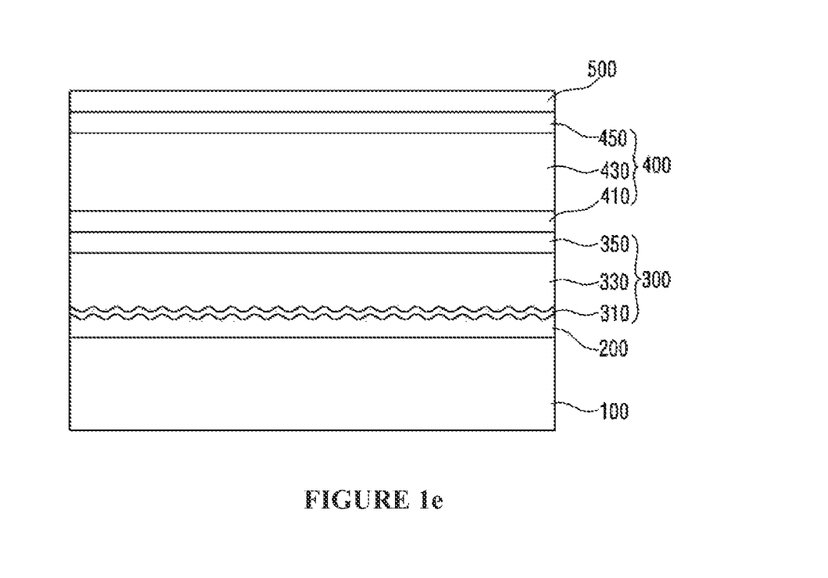

As shown in FIG. 1e, a second electrode 500 is formed on the second unit cell 400.

Figure 2:
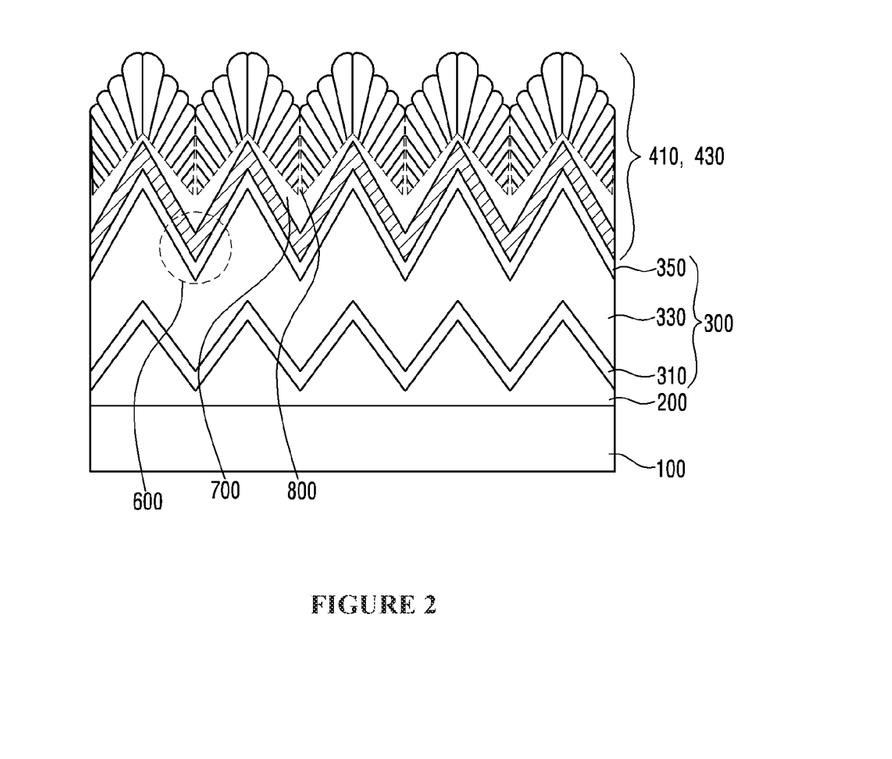
FIG. 2 shows a first conductive semiconductor layer and an intrinsic semiconductor layer without an etching process, each of which is composed of hydrogenated amorphous silicon or hydrogenated amorphous silicon based material.

As described above, in the embodiment of the present invention, the transparent conductive oxide layer is deposited and etched. If not etched, the first unit cell 300 including the intrinsic semiconductor layer 330 comprised of hydrogenated amorphous silicon or hydrogenated amorphous silicon based material is formed on the sharp pyramid-shaped surface of the first electrode 200 as shown in FIG. 2. Therefore, the sharp-shaped texturing structure is formed on the surfaces of the first unit cell 300 and the second unit cell 400.

Here, a V-shaped valley part 600 of the texturing structure or the second unit cell 400 functions as a crack to prevent the hydrogenated microcrystalline silicon or the hydrogenated microcrystalline silicon based material from being formed, and also forms an amorphous incubation film 700 and a large volume of a grain boundary 800. The incubation film 700 and the grain boundary 800 function as a center of recombination of photo-induced electron-hole pairs from the hydrogenated microcrystalline silicon or the hydrogenated microcrystalline silicon based material so that the overall characteristic of the photovoltaic device is deteriorated.

Figure 3:
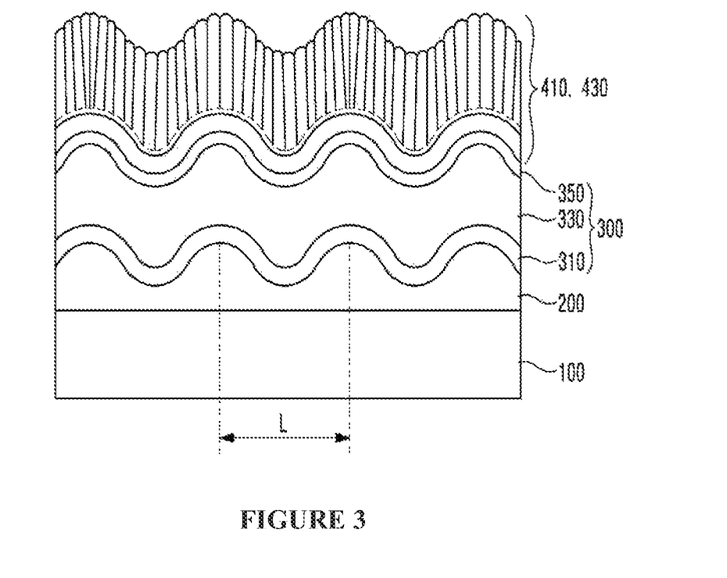
FIG. 3 shows a texture pitch of a first electrode of a photovoltaic device according to the embodiment of the present invention.

Therefore, in the embodiment of the present invention, after the texturing structure is formed on the surface of the first electrode 200, the etching process is performed. When the etching process is performed on the textured structure of the electrode surface, a photovoltaic device shown in FIG. 3 may be formed. That is, as shown in FIG. 3, the surface texture shaped like a pyramid becomes smooth through the etching process. The surface texture shaped like a sharp pyramid is hereby transformed into a smooth surface texture having a "U" shaped valley. The first unit cell 300 is formed on the first electrode 200 having the smooth surface texture. When the microcrystalline silicon or the microcrystalline silicon based material of the second unit cell 400 is deposited on the first unit cell 300, the microcrystalline silicon or the microcrystalline silicon based material of the second unit cell 400 are easily formed, and the incubation film 700 and a large volume of the grain boundary 800 are reduced. As a result, the characteristic of the photovoltaic device is improved.

A ratio of a root mean square (rms) roughness to an average pitch of the texturing structure formed on the surface of the first electrode 200 through the etching process described above may be equal to or more than 0.05 or equal to or less than 0.13. The pitch of the texturing structure is, as shown in FIG. 3, a distance L between two adjacent projections. The average pitch of the texturing structure is a mean value of the pitches. After surface profile of a certain area is measured by using an atomic force microscope (AFM), the rms roughness is obtained through the following expression.

$$\text{rms} = \frac{1}{N}\sum_{i=1}^{N}\sqrt{(Xi-\overline{X})^2}$$

Here, $X_i$ is a measured surface height. $\overline{X}$ is an average surface height.

When a ratio of the rms roughness to the average pitch is less than 0.5, the surface texture of the transparent conductive oxide layer is excessively smoothened, and light scattering effect caused by the first electrode 200 may be reduced. When a ratio of the rms roughness to the average pitch is more than 0.13, the texturing structure becomes excessively rough so that a large volume of the grain boundary 800 may be formed.

As such, when a ratio of the rms roughness to the average pitch of the texturing structure is equal to or more than 0.05 and equal to or less than 0.13, the thickness of the transparent conductive oxide layer may be equal to or more than 1 µm and equal to or less than 2 µm.

In measuring the first electrode 200 formed by the etching process by X-Ray Diffraction (XRD) in θ-2θ geometry, when an intensity of a peak corresponding to $(11\overline{2}0)$ plane is greater than an intensity of peaks corresponding to (0002) and $(10\overline{1}0)$ planes, the pyramid-shaped texturing structure is formed. Accordingly, a ratio of the rms roughness to the average pitch of the texturing structure may become equal to or more than 0.05 and equal to or less than 0.13 through the etching process.

In a case where the first electrode 200 formed by the etching process is made up of ZnO, when a structural analysis and a composition analysis with respect to the depth of ZnO are performed by an X-ray Photoelectron Spectroscopy (XPS), an AUGER electron spectroscope and a Secondary Ion Mass Spectrometer (SIMS), a ratio of Zn/O may be equal to or more than 1.1 and equal to or less than 1.3. When the ratio of Zn/O is equal to or less than 1.3, optical transmittance can be prevented from rapidly being reduced. When the ratio of Zn/O is equal to or more than 1.1, electrical conductivity can be prevented from rapidly being reduced due to the stoichiometric structure.

When the first electrode 200 formed by the etching process is made up of ZnO, a hydrogen containing concentration of the first electrode 200 may be equal to or more than $10^{19}/cm^3$ and equal to or less than $10^{21}/cm^3$. As described above, hydrogen is a shallow level donor in ZnO. The hydrogen can improve conductivity of ZnO and passivate a defect such as oxygen vacancy. When the hydrogen containing concentration is less than $10^{19}/cm^3$, the improvement of ZnO conductivity and the passivation effect are deteriorated. When the hydrogen containing concentration is more than $10^{21}/cm^3$, mobility is degraded because of impurity scattering and optical transmittance of light in the wavelength range longer than 1000 nm may be reduced due to the free carriers absorption (FCA).

When the deposition and etching processes are performed, a resistivity of the first electrode 200 is equal to or less than $2\times10^{-3}$ Ωcm and mobility of the first electrode 200 is equal to or more than 25 $cm^2/Vsec$. A haze ratio of the first electrode 200 formed by the etching process may be equal to or more than 5% and equal to or less than 20% in the wavelength of 600 nm. In addition, a transmittance of the first electrode 200 may be equal to or more than 80% in the wavelength range from 400 nm to 800 nm.

Meanwhile, the present invention may be applied to a p-i-n type photovoltaic device. The first unit cell 300 absorbs more light in a short wavelength range than the second unit cell 400 does. The second unit cell 400 absorbs more light in the longer wavelength range than the first unit cell 300 does.

That is, with regard to the p-i-n type tandem photovoltaic device of the embodiment of the present invention, since light is incident through the substrate 100, the first electrode 200 is composed of the transparent conductive oxide layer, and the first unit cell 300 is composed of hydrogenated amorphous silicon or hydrogenated amorphous silicon based material in order to fully absorb light in a short wavelength range. Here, the surface of the transparent conductive oxide layer is textured. The amorphous incubation film 700 and a large volume of the grain boundary 800 are formed on the hydrogenated microcrystalline silicon or the hydrogenated microcrystalline silicon based material of the second unit cell 400 by the surface texture. In the embodiment of the present invention, the etching process is performed after the transparent conductive oxide layer is deposited. Accordingly, characteristic of the p-i-n type tandem photovoltaic device can be improved.

Next, the photovoltaic device according to the embodiment of the present invention will be described.

The photovoltaic device according to the embodiment of the present invention includes a substrate 100, a first electrode 200, a first unit cell 300, a second unit cell 400 and a second electrode 500.

The first electrode 200 includes a transparent conductive oxide layer. A ratio of a rms roughness to an average pitch of a texturing structure formed on the surface of the first electrode 200 may be equal to or more than 0.05 and equal to or less than 0.13.

The first unit cell 300 is placed on the first electrode 200 and includes a p-type semiconductor layer, an intrinsic semiconductor layer and an n-type semiconductor layer, each of which is sequentially stacked. The intrinsic semiconductor layer of the first unit cell 300 is composed of hydrogenated amorphous silicon or a hydrogenated amorphous silicon based material.

The second unit cell 400 is placed on the first unit cell 300 and includes a p-type semiconductor layer, an intrinsic semiconductor layer and an n-type semiconductor layer, each of which is sequentially stacked. The intrinsic semiconductor layer of the second unit cell 400 is composed of hydrogenated microcrystalline silicon or hydrogenated microcrystalline silicon based material.

The second electrode 500 is placed on the second unit cell 400.

Characteristics of the photovoltaic device according to the embodiment of the present invention have been described above, description thereof will be omitted.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for manufacturing a photovoltaic device, the method comprising:
forming a first electrode by depositing a transparent conductive oxide layer on a substrate, a surface of the transparent conductive oxide layer being formed with peaks having a height;
etching the surface of the transparent conductive oxide layer sufficient to smooth the peaks of the transparent conductive oxide layer, the peaks being reduced in height;
forming a first unit cell comprising a p-type semiconductor layer, an intrinsic semiconductor layer and an n-type semiconductor layer, each of which is sequentially stacked on the first electrode;
forming a second unit cell comprising a p-type semiconductor layer, an intrinsic semiconductor layer and an n-type semiconductor layer, each of which is sequentially stacked on the first unit cell; and
forming a second electrode on the second unit cell,
wherein the intrinsic semiconductor layer of the first unit cell includes hydrogenated amorphous silicon or hydrogenated amorphous silicon based material,
wherein the intrinsic semiconductor layer of the second unit cell includes hydrogenated microcrystalline silicon or hydrogenated microcrystalline silicon based material,
wherein a ratio of a root mean square roughness to an average pitch of a texturing structure formed on the surface of the first electrode is equal to or more than 0.05 and equal to or less than 0.13, and
wherein the forming the first electrode produces V-shaped valleys between the peaks, and the etching changes the V-shaped valleys to U-shaped valleys.

2. The method of claim 1, wherein the transparent conductive oxide layer is deposited by a CVD method to have a thickness of equal to or more than 1 μm and equal to or less than 2 μm.

3. The method of claim 1, wherein, when measuring the first electrode by X-Ray Diffraction (XRD) in θ-2θ geometry, an intensity of a peak corresponding to $(11\bar{2}0)$ plane is greater than an intensity of peaks corresponding to (0002) and $(10\bar{1}0)$ planes.

4. The method of claim 1, wherein the forming the transparent conductive oxide layer comprises depositing the transparent conductive oxide layer including ZnO, and wherein a ratio of Zn/O is equal to or more than 1.1 and equal to or less than 1.3.

5. The method of claim 1, wherein the depositing the transparent conductive oxide layer comprises depositing the transparent conductive oxide layer including ZnO, and wherein a hydrogen containing concentration of the transparent conductive oxide layer is equal to or more than $10^{19}/cm^3$ and equal to or less than $10^{21}/cm^3$.

6. The method of claim 1, wherein a resistivity of the transparent conductive oxide layer is equal to or less than $2\times10^{-3}$ Ωcm, and wherein a mobility of the transparent conductive oxide layer is equal to or more than 25 $cm^2$/Vsec.

7. The method of claim 1, wherein a haze ratio of the transparent conductive oxide layer is equal to or more than 5% and equal to or less than 20% in a wavelength of 600 nm, and wherein a transmittance of the transparent conductive oxide layer is equal to or more than 80% with respect to light in the wavelength range from 400 nm to 800 nm.

8. The method of claim 1, wherein the etching is performed by means of a wet etching process.

9. The method of claim 1, wherein the etching is performed by immersing the substrate which the transparent conductive oxide layer has been deposited on in an acid aqueous solution having a concentration of equal to or more than 0.5% and equal to or less than 5% for equal to or more than 5 seconds and equal to or less than 20 seconds.

10. A method for manufacturing a photovoltaic device, the method comprising:
forming a first electrode by depositing a transparent conductive oxide layer on a substrate, a surface of the transparent conductive oxide layer being formed with peaks having a height;
smoothing the peaks on the surface of the transparent conductive oxide layer, the peaks being reduced in height;
forming a first unit cell comprising a p-type semiconductor layer, an intrinsic semiconductor layer and an n-type semiconductor layer, each of which is sequentially stacked on the first electrode;
forming a second unit cell comprising a p-type semiconductor layer, an intrinsic semiconductor layer and an n-type semiconductor layer, each of which is sequentially stacked on the first unit cell; and
forming a second electrode on the second unit cell;
wherein the intrinsic semiconductor layer of the first unit cell includes hydrogenated amorphous silicon or hydrogenated amorphous silicon based material;
wherein the intrinsic semiconductor layer of the second unit cell includes hydrogenated microcrystalline silicon or hydrogenated microcrystalline silicon based material; and
wherein the forming the first electrode produces V-shaped valleys between the peaks, and the smoothing changes the V-shaped valleys to U-shaped valleys.

11. The method of claim 10, wherein the peaks of the surface of the transparent conductive oxide layer are smoothed sufficiently to avoid formation of an amorphous incubation film between the first unit cell and the second unit cell.

12. The method of claim 10, wherein a ratio of a root mean square roughness to an average pitch of a texturing structure formed on the surface of the first electrode is equal to or more than 0.05 and equal to or less than 0.13.

13. The method of claim 10, wherein the transparent conductive oxide layer is deposited by a CVD method to have a thickness of equal to or more than 1 μm and equal to or less than 2 μm.

14. The method of claim 10, wherein, when measuring the first electrode by X-Ray Diffraction (XRD) in θ-2θ geometry, an intensity of a peak corresponding to $(11\bar{2}0)$ plane is greater than an intensity of peaks corresponding to (0002) and $(10\bar{1}0)$ planes.

15. The method of claim 10, wherein the forming the transparent conductive oxide layer comprises depositing the transparent conductive oxide layer including ZnO, and wherein a ratio of Zn/O is equal to or more than 1.1 and equal to or less than 1.3.

16. The method of claim 10, wherein the depositing the transparent conductive oxide layer comprises depositing the transparent conductive oxide layer including ZnO, and wherein a hydrogen containing concentration of the transparent conductive oxide layer is equal to or more than $10^{19}/cm^3$ and equal to or less than $10^{21}/cm^3$.

17. The method of claim 10, wherein a resistivity of the transparent conductive oxide layer is equal to or less than $2\times10^{-3}$ Ωcm, and wherein a mobility of the transparent conductive oxide layer is equal to or more than 25 $cm^2$/Vsec.

18. The method of claim 10, wherein a haze ratio of the transparent conductive oxide layer is equal to or more than 5% and equal to or less than 20% in a wavelength of 600 nm, and wherein a transmittance of the transparent conductive oxide layer is equal to or more than 80% with respect to light in the wavelength range from 400 nm to 800 nm.

19. The method of claim 10, wherein the smoothing is performed by means of a wet etching process.

20. The method of claim 19, wherein the etching is performed by immersing the substrate which the transparent conductive oxide layer has been deposited on in an acid aqueous solution having a concentration of equal to or more than 0.5% and equal to or less than 5% for equal to or more than 5 seconds and equal to or less than 20 seconds.

* * * * *